United States Patent
Ludwig et al.

(10) Patent No.: US 10,078,137 B2
(45) Date of Patent: Sep. 18, 2018

(54) LIDAR DEVICE AND METHOD FOR CLEAR AND DEGRADED ENVIRONMENTAL VIEWING CONDITIONS

(71) Applicants: David Ludwig, Irvine, CA (US); Alan C. Rogers, Anaheim, CA (US); Medhat Azzazy, Laguna Niguel, CA (US); James W. Justice, Newport Beach, CA (US)

(72) Inventors: David Ludwig, Irvine, CA (US); Alan C. Rogers, Anaheim, CA (US); Medhat Azzazy, Laguna Niguel, CA (US); James W. Justice, Newport Beach, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 0 days.

(21) Appl. No.: 14/311,283

(22) Filed: Jun. 21, 2014

(65) Prior Publication Data

US 2014/0375977 A1    Dec. 25, 2014

Related U.S. Application Data

(60) Provisional application No. 61/837,839, filed on Jun. 21, 2013.

(51) Int. Cl.
*G01S 17/89* (2006.01)
*G01R 31/36* (2006.01)

(52) U.S. Cl.
CPC ......... *G01S 17/89* (2013.01); *G01R 31/3606* (2013.01)

(58) Field of Classification Search
CPC ...................................................... G01C 3/08
USPC ........... 356/3.01–3.15, 4.01–4.1, 5.01–5.15, 356/6–22, 28, 28.5
See application file for complete search history.

(56) References Cited

U.S. PATENT DOCUMENTS

| 8,203,702 | B1* | 6/2012 | Kane et al. ............... 356/139.05 |
| 2010/0191418 | A1* | 7/2010 | Mimeault ............ B60Q 1/0023 701/36 |
| 2012/0044476 | A1* | 2/2012 | Earhart ................. G01S 3/7867 356/4.01 |
| 2013/0128257 | A1* | 5/2013 | Stettner .................. G01S 17/06 356/4.01 |

* cited by examiner

*Primary Examiner* — Luke D Ratcliffe
(74) *Attorney, Agent, or Firm* — W. Eric Boyd, Esq.

(57) ABSTRACT

A LIDAR system that can accommodate both a clear atmosphere and be adaptable to environments in which smoke, dust or other particulates (i.e., a degraded environment) exist in the atmosphere around the target is described. The system operates in two fields of regard: clear view mode (wide field of regard) and a degraded view mode (narrow field of regard). The wide field of regard allows the output laser energy to be concentrated over a large number of detector pixels and thus resulting in high scene scan rate. The narrow field of regard allows concentrating the laser output energy on fewer pixels to compensate for the loss of laser energy due to atmospheric degradation. The combination of the ROIC and LIDAR modes of operation result in a system that is capable of operation under clear and degraded environments.

13 Claims, 3 Drawing Sheets

LIDAR DEVICE AND METHOD FOR CLEAR AND DEGRADED ENVIRONMENTAL VIEWING CONDITIONS

CROSS-REFERENCE TO RELATED APPLICATIONS

This application claims the benefit of U.S. Provisional Patent Application No. 61/837,839, filed on Jun. 21, 2013 entitled "LIDAR Device and Method for Clear and Degraded Environmental Viewing Conditions" pursuant to 35 USC 119, which application is incorporated fully herein by reference.

STATEMENT REGARDING FEDERALLY SPONSORED RESEARCH AND DEVELOPMENT

N/A

BACKGROUND OF THE INVENTION

1. Field of the Invention

The invention relates generally to the field of electronic imaging and LIDAR (Laser, Imaging, Detecting and Ranging) systems. More specifically, the invention relates to a LIDAR device and method having a fine resolution mode and a course resolution mode for clear air and degraded environmental viewing conditions.

2. Description of the Related Art

In general, existing time of flight LIDAR imaging systems include a laser imaging source, appropriate optics in conjunction with a two-dimensional detector array such as a focal plane array or "FPA", processing circuitry suitable for processing the detector array output into a usable form and post-processing circuitry and software capable of taking the processed detector array output and converting it into a usable format such as a three-dimensional voxel image on an electronic display.

In the operation of a typical prior art time of flight LIDAR system, a set of laser pulses are directed toward and illuminate a desired target or scene of interest. The laser reflections or "echoes" from the entire field of view from the scene are received and imaged upon substantially all of the detectors in a two-dimensional set of detector array pixels using appropriate optics.

Because the time of flight of the returning laser echoes will vary proportionally to the distance from the detector array image plane and the target surface features from which the echoes are received, a three-dimensional image can be calculated based upon the relative echo delays.

The laser target transmission and return energy in a LIDAR system is greatly affected by the medium in which the imaging beam travels and dust or smoke in the atmosphere in which the target of interest is located will affect the quality of the image of a LIDAR system.

What is needed is a LIDAR device and method that can accommodate both a clear atmosphere and be adaptable to environments in which smoke, dust or other particulates (i.e., a degraded environment) exist in the atmosphere around the target

BRIEF SUMMARY OF THE INVENTION

No solution to the variable target environments mentioned is known. These and other aspects, embodiments and features of the invention will be better understood in the context of the accompanying drawings and the following detailed descriptions of preferred embodiments.

The invention and its various embodiments can now be better understood by turning to the following detailed description of the preferred embodiments which are presented as illustrated examples of the invention defined in the claims.

It is expressly understood that the invention as defined by the claims may be broader than the illustrated embodiments described below.

DETAILED DESCRIPTION OF THE INVENTION

Figure 1:
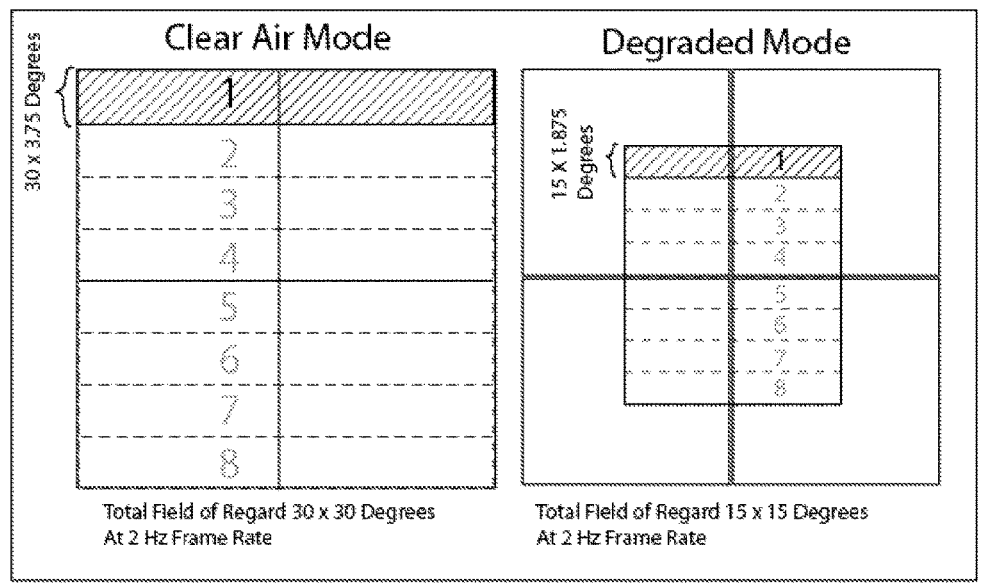
FIG. 1 depicts laser illumination scan of the detector field of view for both the narrow field of view and wide field of view modes of operation.
Figure 2:
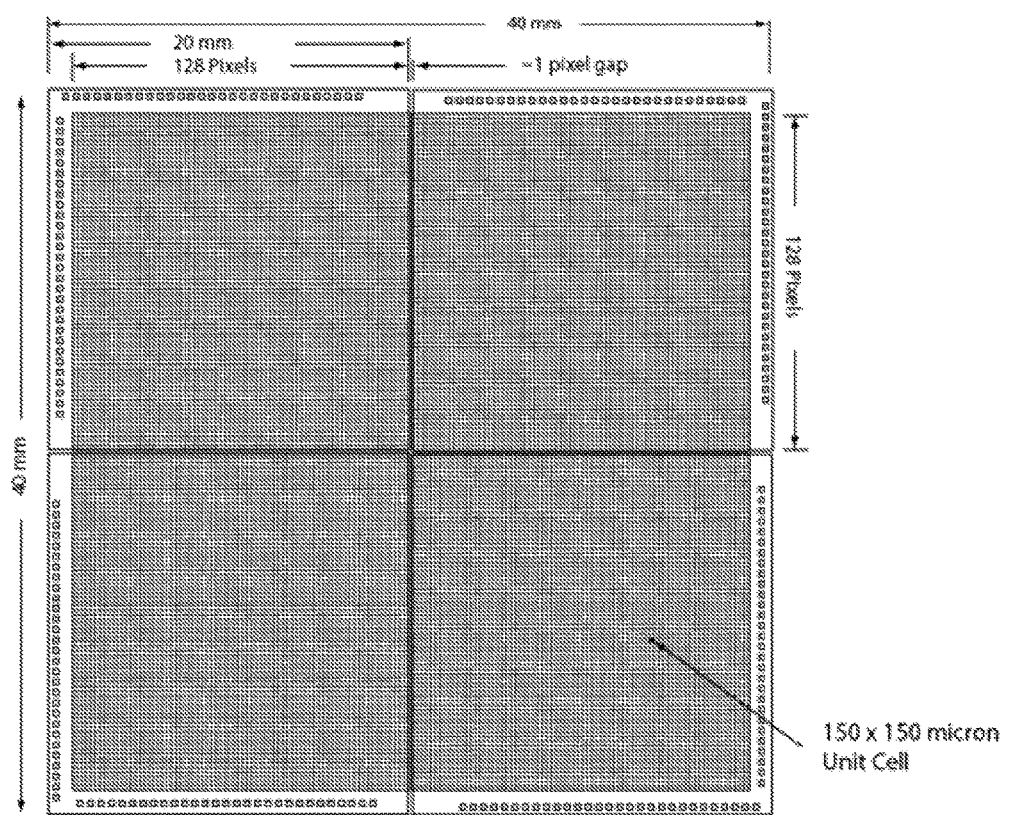
FIG. 2 is a schematic of an exemplar focal plane array with Read-out Integrated Circuit (ROIC).
Figure 3:
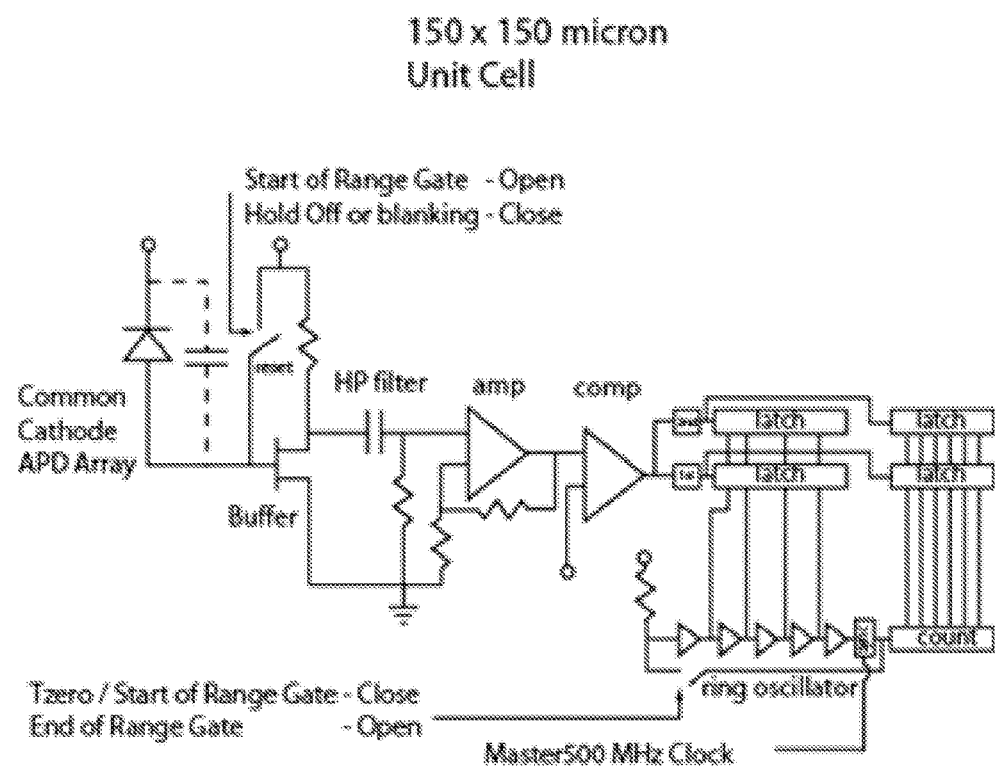
FIG. 3 is a schematic exemplar of the ROIC for a single pixel (unit cell).

Turning now to FIGS. 1-3 wherein like references define like elements among the several views, Applicant discloses a LIDAR device and method suitable for imaging in a clear and degraded target environment.

The LIDAR system of the invention is configured to operate with two fields of regard: 1) a clear view mode (i.e., wide field of regard) and, 2) a degraded view mode (i.e., narrow field of regard).

The narrow field permits concentrating the system laser pulse on fewer pixels in order to increase penetration of degraded visual conditions and/or extend range in good visual conditions.

The wide field desirably permits a comparable or matching scene overlay with an optionally-provided system LWIR or SWIR camera.

FIG. 1 depicts how the illumination scan is projected onto the focal plane in the two different modes.

Only the illumination beam of the system is mechanically scanned; the receiver's 256×256 detectors stare into their field of view and are electrically read out as appropriate. It is expressly noted the LIDAR system of the invention is not limited to a 256×256 detector array and that any detector pixel size suitable for the user may be incorporated in the invention.

In the wide field of regard or clear air mode of FIG. 1, the illumination beam is preferably formed into a 30×3.75 degree rectangle that covers about $\frac{1}{8}^{th}$ of the focal plane. A single pulse is fired at position 1 in the illustration of FIG. 1.

The illuminated portion of the focal plane is read out prior to the illumination beam being directed to position 2 of the clear air mode of FIG. 1.

In the degraded mode of operation of FIG. 1, the illumination beam is reduced by a factor of two in each dimension. In the degraded mode example of FIG. 1, the 15×1.875 degree beam thus covers only $\frac{1}{16}^{th}$ of the focal plane. The illuminated pixels are read out prior to the reflected illumination beam being stepped into position 2 of the degraded mode of FIG. 1 and so on.

A small galvo, which can be precisely programmed for each mode, is desirably used to control the illumination scan. In the illustrated embodiment, the degraded mode of operation delivers about four times the laser power to each pixel, extending the range by a factor of two over the wide field of view mode or for increasing the penetration of the laser in degraded conditions to meet variable atmospheric conditions.

A preferred embodiment of the optics of the system may comprise a receiver with a six cm aperture and 72 mm focal length, optimized with 1.5 micron anti-reflection coatings and 150 um pixel size, and deviates only slightly from readily available COTS full-frame interchangeable camera lenses.

The invention comprises a receiver focal plane or FPA which may be comprised a two dimensional array of 256×256 active pixels in a preferred embodiment. Each pixel may be 150×150 microns. The use of a 150×150 micron unit cell and the 130 nm IBM BiCMOS GeSi fabrication process assure adequate bandwidth and real estate for a compact design implementation.

An exemplar structure of the focal plane array of the device is shown in FIG. 2. The four components of the focal plane may comprise two-side buttable imager/ROIC stacks. This permits the ROIC and detector arrays to be manufactured within reticle limits without stitching. Each array may comprise 128×128 pixels in a physical format of 20×20 mm. The detector array may be bump-bonded onto the ROIC. The resulting detector array may comprise dimensions of about 19.2×19.2 mm.

An exemplar ROIC unit cell circuit is shown in FIG. 3. The detector array is preferably designed with a common cathode. The bump-bonded anodes are connected to a source follower buffer.

The reflected laser pulse energy received from the target surface is integrated onto the detector's parasitic capacitor. The capacitor is initially charged by a reset switch and then released at $T_{zero}$. The reflected energy discharges the parasitic capacitor. A high pass filter differentiates the integrated signal and transforms it back into a pulse.

The amplifier of the system boosts the signal above the comparator's offset voltage. The comparator trips states whenever the reflected pulse signal transitions its threshold voltage.

The comparator's transition latches the timing circuit's state. The timing circuit comprises a ring oscillator that is held in reset until the $T_{zero}$ pulse, and a counter circuit.

When the $T_{zero}$ is released, the ring oscillator (inverters with an odd number of stages) begins to toggle "ones" and "zeros" at speeds that can be tailored by design. The ring oscillator's stages necessarily have propagation delay which is used to refine the reflection time of arrival measurement (the entire delay through the ring may be about two nsec).

A counter is placed at the end of the ring oscillator that accumulates the number of "ones" that pass through. When the comparator trips, both the state of the counter and the ring oscillator are captured in a series of latches.

The ring oscillator and counter continue until the end of the range gate. If a second pulse arrives within the range gate, the states are saved in a second set of latches; up to four latches per unit cell may be used if desired. This last latch can be overwritten by a subsequent return pulse, thus assuring that the last reflected pulse-per-pixel is captured. The counter may be synchronized with a master 500 MHz clock to eliminate time drifts.

Each counter latch will be 16 bits long in the illustrated embodiment. Each ring oscillator latch may be four or six bits long. Thus, with a 500 MHz master clock, the counter will allow for about a 35 cm range resolution and the ring oscillator will refine this measurement by a factor of about four or about 6.0-7.5 cm or less.

The total range gate is defined by the 16 bit counter and 500 MHz clock (2.3 Km). The length of the range gate always remains the same, but it can be positioned anywhere in space, for example to search for high reflectivity targets beyond two kilometers by holding the ROIC in reset for a specific period after the $T_{zero}$.

We claim:

1. A LIDAR device comprising:
   a steerable laser beam source; a focal plane array; and a beam shaping optical element configured for operation in clear and in degraded visual environments wherein the device performs a detection, ranging, and imaging of objects when obscurant material in the atmosphere along a path of illumination reduces the brightness of a return signal when compared to the brightness observed when the path of illumination is clear;
   wherein the performance is achieved by operating in a wide field of regard mode when conditions are clear and operating in a narrow field of regard mode when atmospheric conditions are obscured or degraded;
   wherein the operation in the narrow field of regard mode comprises:
   reducing an illumination beam by a factor in each of an X and Y focal plane array detector dimension to define an illuminated portion to increase penetration of degraded visual conditions whereby the return signal is concentrated on a fewer number of pixels than when the LIDAR device is operating in the wide field of regard mode;
   reading out the illuminated portion at a first position on the focal plane array;
   directing the illumination beam to a second position on the focal plane array; and;
   reading out a the illuminated portion at the second position;
   the LIDAR device operating with a laser at a laser wavelength which is minimally affected by the obscurants when operating in the narrow field of regard mode.

2. The LIDAR device of claim 1 comprising a two dimensional detector array which fully covers the wide field of regard.

3. The LIDAR device of claim 1 that, when operating in the wide field of regard mode, causes the laser to illuminate a substantial portion of the wide field of regard with each pulse fired and uses multiple pulses to completely illuminate an entire field of regard.

4. The LIDAR device of claim 1, when operating in the narrow field of regard mode, configured to cause the laser to illuminate a small portion of the field of regard with each pulse fired and configured to use multiple pulses to illuminate only a fraction of the wide field of regard with the fraction illuminated determined by the type and degree of obscuration occurring in the illumination path.

5. The LIDAR device of claim 1 configured to detect the range to objects which reflect a portion of the illumination beam back to the LIDAR using a time of flight technique to determine a range.

6. The LIDAR device of claim 1 configured to detect multiple objects at differing ranges within the same pixel.

7. A LIDAR device comprising:
   a steerable laser beam source; a focal plane array; and a beam shaping optical element;
   the LIDAR device configured for operation in a wide field of regard mode and in a narrow field of regard mode;

wherein the narrow field of regard mode comprises reducing the laser beam by a factor in each of an X and Y focal plane array dimension to increase a penetration of a degraded visual condition whereby a reflected laser beam pulse is concentrated on a fewer number of pixels than in the wide field of regard mode;

the laser beam source operating at a wavelength minimally affected by an obscurant when in the narrow field of regard mode;

the focal plane array configured to perform the functions of;

a) when in the narrow field of regard mode, causing the laser source to illuminate a portion of the field of regard with each beam pulse and using multiple beam pulses to illuminate a fraction of the wide field of regard, wherein the fraction is determined by the type and degree of obscuration; and;

b) detecting a range to objects which reflect beam pulse using a time of flight technique.

8. The LIDAR device of claim 1 configured to produce point cloud information on a resolved target observed by combining a set of outputs of a set of multiple pulses of the laser that illuminates a target.

9. The LIDAR device of claim 1 comprising optical elements that shape a transmit beam to achieve a uniform illumination of an area struck by the pulse and b) image the return signal onto the detector array.

10. The LIDAR device of claim 1 comprising means, mechanical or electronic, to steer a transmitted laser beam over the wide and narrow fields of regard.

11. The LIDAR device of claim 7 configured to produce point cloud information on a resolved target observed by combining a set of outputs of a set of multiple pulses of the laser that illuminates a target.

12. The LIDAR device of claim 7 comprising optical elements that shape a transmit beam to achieve a uniform illumination of an area struck by the pulse and image the return signal onto the detector array.

13. The LIDAR device of claim 7 comprising means, mechanical or electronic, to steer a transmitted laser beam over the wide and narrow fields of regard.

* * * * *